United States Patent
Liu

(10) Patent No.: US 10,825,854 B2
(45) Date of Patent: Nov. 3, 2020

(54) STACKED PHOTO SENSOR ASSEMBLY WITH PIXEL LEVEL INTERCONNECT

(71) Applicant: Facebook Technologies, LLC, Menlo Park, CA (US)

(72) Inventor: Xinqiao Liu, Medina, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 123 days.

(21) Appl. No.: 15/801,216

(22) Filed: Nov. 1, 2017

(65) Prior Publication Data

US 2019/0057995 A1     Feb. 21, 2019

Related U.S. Application Data

(60) Provisional application No. 62/546,476, filed on Aug. 16, 2017.

(51) Int. Cl.
*H01L 27/146* (2006.01)
*H04N 5/335* (2011.01)

(52) U.S. Cl.
CPC .... *H01L 27/14634* (2013.01); *H01L 27/1464* (2013.01); *H01L 27/14612* (2013.01); *H04N 5/335* (2013.01); *H01L 27/14636* (2013.01); *H01L 27/14643* (2013.01)

(58) Field of Classification Search
CPC ......... H01L 27/14634; H01L 27/14636; H01L 27/14638; H01L 27/14643; H01L 27/14612; H01L 27/1464; H01L 27/14601; H01L 27/146; H01L 27/14603; H01L 27/14605; H01L 27/14609; H01L 27/1461; H04N 5/335; H04N 5/3355; H04N 5/379; H04N 5/369
See application file for complete search history.

(56) References Cited

U.S. PATENT DOCUMENTS

| | | | |
|---|---|---|---|
| 8,134,623 B2 | 3/2012 | Purcell et al. | |
| 8,144,227 B2 * | 3/2012 | Kobayashi | H04N 5/379 348/308 |
| 8,773,562 B1 | 7/2014 | Fan | |

(Continued)

FOREIGN PATENT DOCUMENTS

| | | |
|---|---|---|
| EP | 0675345 A2 | 10/1995 |
| EP | 1746820 A1 | 1/2007 |

OTHER PUBLICATIONS

PCT International Search Report and Written Opinion, PCT Application No. PCT/US2018/045673, dated Dec. 4, 2018, 15 pages.

(Continued)

*Primary Examiner* — John R Lee
(74) *Attorney, Agent, or Firm* — Kilpatrick Townsend & Stockton LLP

(57) ABSTRACT

Embodiments relate to a stacked photo sensor assembly where two substrates that are stacked vertically. The two substrates are connected via interconnects at a pixel level to provide a signal from a photodiode at a first substrate to circuitry on a second substrate. The circuitry on the second substrate performs operations that were conventionally performed on first substrate. By stacking the first and second substrates, the photo sensor assembly can be made more compact while increasing or at least retaining the photodiode fill factor of the photo sensor assembly.

16 Claims, 4 Drawing Sheets

(56) References Cited

U.S. PATENT DOCUMENTS

| | | | |
|---|---|---|---|
| 8,779,346 B2 | 7/2014 | Fowler et al. | |
| 8,946,610 B2* | 2/2015 | Iwabuchi | H01L 23/481 250/208.1 |
| 9,094,629 B2 | 7/2015 | Ishibashi | |
| 9,343,497 B2* | 5/2016 | Cho | H01L 27/14618 |
| 9,363,454 B2 | 6/2016 | Ito et al. | |
| 9,478,579 B2* | 10/2016 | Dai | H01L 27/14609 |
| 10,003,759 B2* | 6/2018 | Fan | H01L 27/14643 |
| 10,419,701 B2 | 9/2019 | Liu | |
| 2003/0020100 A1 | 1/2003 | Guidash | |
| 2003/0049925 A1* | 3/2003 | Layman | H01L 24/81 438/614 |
| 2004/0095495 A1* | 5/2004 | Inokuma | H04N 5/2253 348/308 |
| 2005/0057389 A1 | 3/2005 | Krymski | |
| 2006/0023109 A1* | 2/2006 | Mabuchi | H01L 24/17 348/340 |
| 2007/0222881 A1 | 9/2007 | Mentzer | |
| 2008/0001065 A1 | 1/2008 | Ackland | |
| 2008/0088014 A1* | 4/2008 | Adkisson | H01L 27/14618 257/737 |
| 2010/0140732 A1 | 6/2010 | Eminoglu et al. | |
| 2010/0276572 A1* | 11/2010 | Iwabuchi | H01L 23/481 250/208.1 |
| 2011/0049589 A1* | 3/2011 | Chuang | H01L 27/14609 257/292 |
| 2011/0254986 A1 | 10/2011 | Nishimura et al. | |
| 2012/0133807 A1 | 5/2012 | Wu et al. | |
| 2012/0262616 A1 | 10/2012 | Sa et al. | |
| 2012/0273654 A1 | 11/2012 | Hynecek et al. | |
| 2013/0020466 A1* | 1/2013 | Ayers | H01L 27/14609 250/208.1 |
| 2013/0056809 A1 | 3/2013 | Mao et al. | |
| 2013/0057742 A1 | 3/2013 | Nakamura et al. | |
| 2013/0082313 A1* | 4/2013 | Manabe | H01L 27/14603 257/292 |
| 2013/0126710 A1 | 5/2013 | Kondo | |
| 2013/0141619 A1 | 6/2013 | Lim et al. | |
| 2013/0207219 A1 | 8/2013 | Ahn | |
| 2013/0299674 A1 | 11/2013 | Fowler et al. | |
| 2014/0042299 A1 | 2/2014 | Wan et al. | |
| 2014/0042582 A1* | 2/2014 | Kondo | H01L 31/02 257/443 |
| 2014/0085523 A1* | 3/2014 | Hynecek | H01L 27/14605 348/311 |
| 2014/0176770 A1 | 6/2014 | Kondo | |
| 2015/0090863 A1 | 4/2015 | Mansoorian et al. | |
| 2015/0172574 A1 | 6/2015 | Honda et al. | |
| 2015/0189209 A1 | 7/2015 | Yang et al. | |
| 2015/0279884 A1 | 10/2015 | Kusumoto | |
| 2015/0312502 A1 | 10/2015 | Borremans | |
| 2016/0028974 A1 | 1/2016 | Guidash et al. | |
| 2016/0037111 A1* | 2/2016 | Dai | H04N 5/378 250/208.1 |
| 2016/0088253 A1 | 3/2016 | Tezuka | |
| 2016/0100115 A1 | 4/2016 | Kusano | |
| 2016/0165160 A1 | 6/2016 | Hseih et al. | |
| 2016/0360127 A1 | 12/2016 | Dierickx et al. | |
| 2017/0053962 A1* | 2/2017 | Oh | H01L 27/14614 |
| 2017/0062501 A1 | 3/2017 | Velichko et al. | |
| 2017/0104021 A1 | 4/2017 | Park et al. | |
| 2017/0104946 A1* | 4/2017 | Hong | H04N 5/37452 |
| 2017/0170223 A1 | 6/2017 | Hynecek et al. | |
| 2019/0052788 A1* | 2/2019 | Liu | H04N 5/2353 |
| 2019/0056264 A1* | 2/2019 | Liu | G01J 1/44 |
| 2019/0057995 A1* | 2/2019 | Liu | H01L 27/14634 |
| 2019/0058058 A1* | 2/2019 | Liu | H01L 29/765 |

OTHER PUBLICATIONS

European Extended Search Report, European Application 18188962.7, dated Oct. 23, 2018, 8pages.

U.S. Appl. No. 15/847,517, "Non-Final Office Action", dated Nov. 23, 2018, 21 pages.

U.S. Appl. No. 15/847,517, "Notice of Allowance", dated May 1, 2019, 11 pages.

U.S. Appl. No. 16/566,583, "Non-Final Office Action", dated Oct. 1, 2019, 10 pages.

Cho, et al., "A Low Power Dual CDS for a Column-Parallel CMOS Image Sensor", Journal of Semiconductor Technology and Science, vol. 12, No. 4, Dec. 30, 2012, pp. 388-396.

EP18179838.0, "Extended European Search Report", dated May 24, 2019, 17 pages.

EP18179838.0, "Partial European Search Report", dated Dec. 5, 2018, 14 pages.

EP18179846.3, "Extended European Search Report", dated Dec. 7, 2018, 10 pages.

EP18179851.3, "Extended European Search Report", dated Dec. 7, 2018, 8 pages.

EP18188962.7, "Office Action", dated Aug. 28, 2019, 6 pages.

Kavusi, et al., "Quantitative Study of High-Dynamic-Range Image Sensor Architectures", Proceedings of SPIE, The International Society for Optical Engineering, vol. 5301, XP055186908, Jun. 7, 2004, pp. 264-275.

PCT/US2018/039350, "International Search Report and Written Opinion", dated Nov. 15, 2018, 13 pages.

PCT/US2018/039352, "International Search Report and Written Opinion", dated Oct. 26, 2018, 10 pages.

PCT/US2018/039431, "International Search Report and Written Opinion", dated Nov. 7, 2018, 14 pages.

* cited by examiner

STACKED PHOTO SENSOR ASSEMBLY WITH PIXEL LEVEL INTERCONNECT

CROSS REFERENCE TO RELATED APPLICATION

This application claims priority under 35 U.S.C. § 119(e) to U.S. Patent Application No. 62/546,476 filed on Aug. 16, 2017, which is incorporated by reference in its entirety.

BACKGROUND

The present disclosure relates generally to optical sensors, and more particularly, to backside illumination optical sensors for machine vision.

Optical sensors are electronic detectors that convert light into an electronic signal. In photography, a shutter is a device that allows light to pass for a determined period of time, exposing the optical sensors to the light in order to capture an image of a scene. Rolling shutter is a method of image capture in which a still picture or each frame of a video is captured by scanning across the scene rapidly in a horizontal or vertical direction. That is, every pixel is not captured at the same time; pixels from different rows are captured at different times. Rolling shutter is mostly used in cell phone sensors. Machine vision, in contrast, uses global shutter where every pixel is captured at the same time.

Most optical sensors use backside illumination. A back-illuminated sensor is a type of digital optical sensor that uses a particular arrangement of imaging elements to increase the amount of light captured, improving low-light performance. A traditional front-illuminated digital camera is constructed similarly to the human eye, with a lens at the front and photodetectors at the back. This orientation of the sensor places the active matrix of the digital camera sensor, a matrix of individual picture elements, on its front surface and simplifies manufacturing. The matrix and its wiring, however, reflect some of the light, reducing the signal that is available to be captured. A back-illuminated sensor contains the same elements, but arranges the wiring behind the photocathode layer by flipping the silicon wafer during manufacturing and then thinning its reverse side so that light can hit the photocathode layer without passing through the wiring layer, thereby improving the chance of an input photon being captured.

However, there are problems associated with conventional back-illuminated sensors. Storage is exposed to light, which causes higher leakage. Also, the photodiode fill factor, or the ratio of light-sensitive area of a pixel to total pixel area, is low. A large fill factor is ideal because more of the pixel area is used for photocollection, which simultaneously improves signal-to-noise ratio (SNR) and dynamic range. The dynamic range of an image sensor measures how wide of a range of lighting the sensor can accurately capture. The wider the dynamic range of the image sensor, the more details can be shown under low light conditions and thus the more versatile the imaging system becomes. The SNR of an image sensor measures the ratio between the signal and its associated noise. An image sensor with low SNR will have a high amount of noise appearing in the captured image. An image sensor with high SNR can be used in low light conditions. Due to problems associated with existing back-illuminated sensors, an improved photo assembly would be desirable.

SUMMARY

Embodiments relate to a pixel of a photo sensor with stacked substrates and a pixel level interconnect that connects circuits in the stacked substrates. The pixel may include a portion of a first substrate, a portion of a second substrate having a circuit for processing a signal from the first substrate; and the pixel level interconnect. The portion of the first substrate includes a photodiode for detecting light, and a diffusion well associated with the photodiode to store photocharge from the photodiode. The amount of charge stored in the diffusion well depends on duration and intensity of the light incident on the photodiode. The pixel level interconnect connects the second diffusion well of the first substrate to the circuit of the second substrate to carry the signal from the second diffusion well to the circuit.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

Reference will now be made in detail to the preferred embodiment, an example of which is illustrated in the accompanying drawings. Whenever possible, the same reference numbers will be used throughout the drawings to refer to the same or like parts.

Embodiments relate to a stacked photo sensor assembly where two substrates that are stacked vertically. The two substrates are connected via interconnects at a pixel level to provide a signal from a photodiode at a first substrate to circuitry on a second substrate. The circuitry on the second substrate performs operations that were conventionally performed on first substrate. By stacking the first and second substrates, the photo sensor assembly can be made more compact while increasing or at least retaining the photodiode fill factor of the photo sensor assembly.

Example System Architecture

Figure 1:
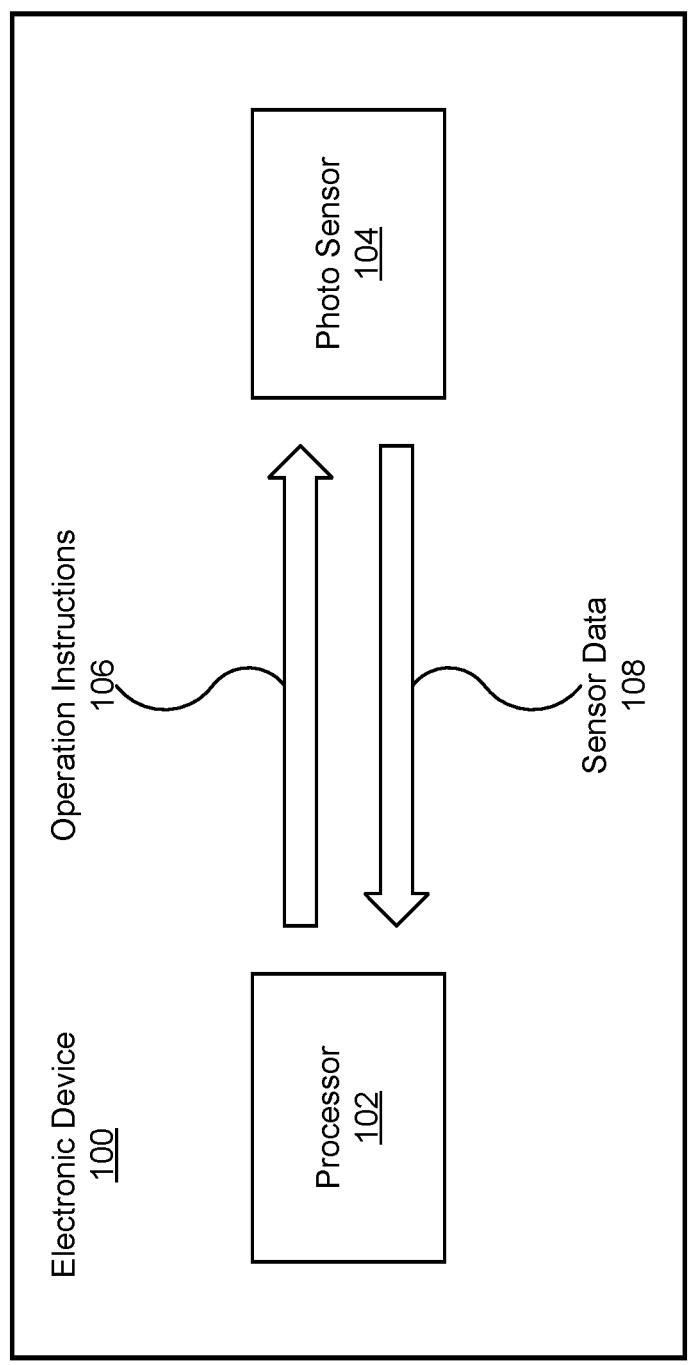
FIG. 1 is a high-level block diagram illustrating the electronic device, according to one embodiment.

FIG. 1 is a high-level block diagram illustrating the electronic device, according to one embodiment. In one embodiment, the electronic device 100 includes, among other components, a processor 102 and a photo sensor 104 that are commutatively coupled. The electronic device 100 may include other components not illustrated in FIG. 1 such as memory and various other sensors.

The processor 102 is an electronic circuit that performs operations on a data source. The data source may include the photo sensor 104 that provides sensor data 108. The processor 102 generates operation instructions 106 that are sent to the photo sensor 104. The processing performed by the processor 102 may include an analog-digital conversion of the sensor data 108, which converts voltage analog signals or current analog signals into digital signals.

The photo sensor 104 is a circuit that measures light intensity and performs a photoconversion. Measuring light intensity may involve detecting light by a photodiode and the photoconversion may involve converting the light by the photodiode into a voltage or current signal.

Figure 2:
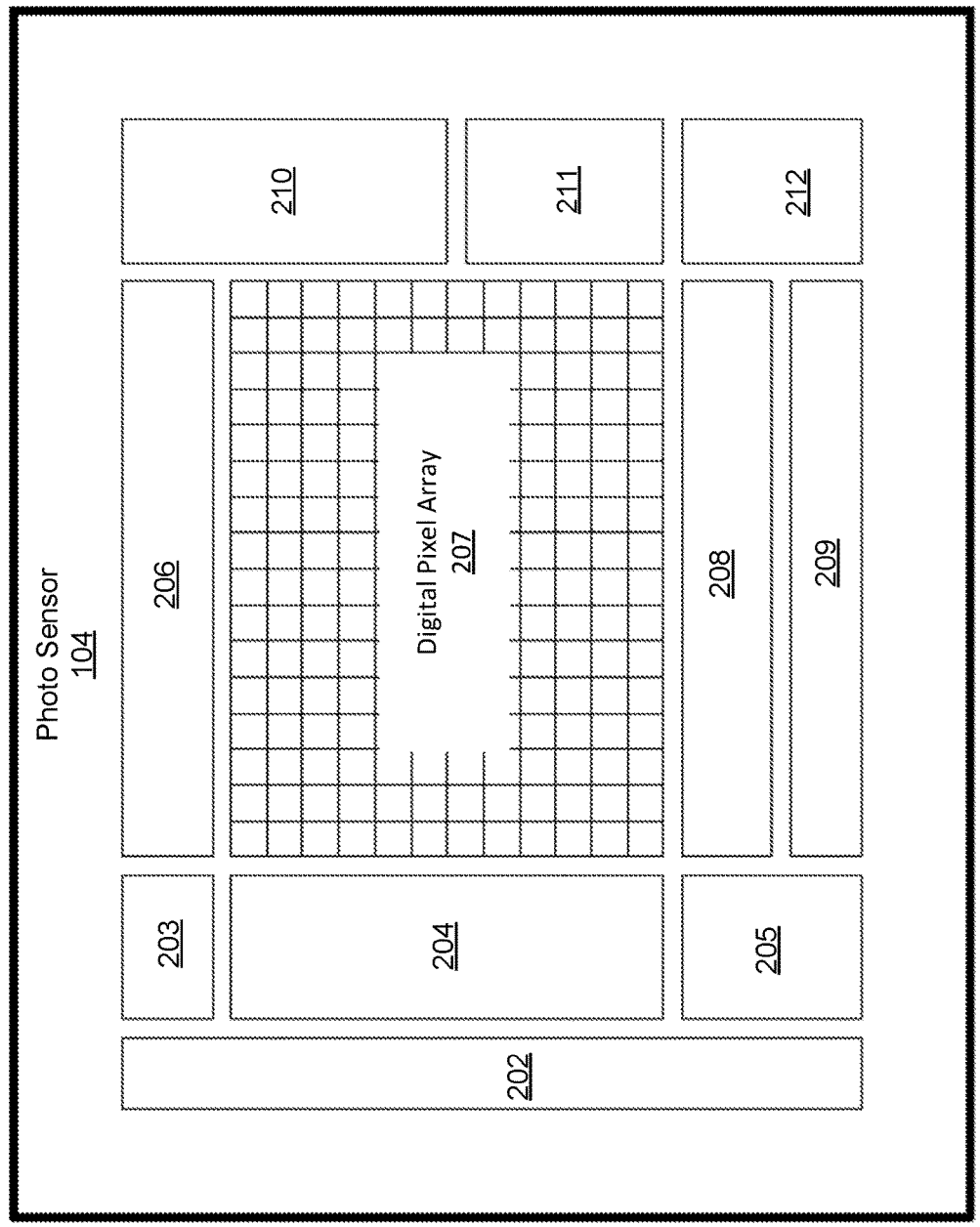
FIG. 2 is a view illustrating the sensor architecture, according to one embodiment.

FIG. 2 is a schematic view illustrating the photo sensor 104, according to one embodiment. The photo sensor 104 includes, among other components, a digital block 202, a global counter 203, a row drivers and global signal drivers module 204, Mobile Industry Processor Interface (MIPI) 205, counter buffers 206, a digital pixel array 207, sense amplifiers 208, a line memory 209, a power conditioner 210, a ramp generation and buffers module 211, and a sense amplification biasing module 212.

The digital block 202 is a circuit that processes digital signals associated with the operation of the photo sensor 104. In one or more embodiments, at least part of the digital block 202 may be provided as part of the digital pixel array 207 instead of being a circuit separate from the digital pixel array 207.

The global counter 203 is a digital sequential logic circuit constructed of cascading flip-flops, and provides counter signals to various components of the photo sensor 104.

The row drivers and global signal drivers module 204 is a circuit that provides signals to rows of pixels via scan lines (not shown). The signal provided to each row of pixels indicates sensing of image signal and/or resetting operations at each row of pixels.

MIPI 205 is a serial interface for transmitting the sensor data 108 from the photo sensor 104 to the processor 102. An MIPI interface typically has a single clock lane and two data lanes (not shown) that carry serial data. These three lanes carry signals on pairs of wires where the signals are often differential.

The counter buffers 206 is a circuit that receives counter signals from the global counter 203, and sends signals to columns of pixels in the digital pixel array 207 to coordinate sensing and resetting operations.

The digital pixel array 207 includes a plurality of pixels. In one embodiment, the digital pixel array is arranged in two dimensions, addressable by row and column. Each pixel is configured to sense light and output a signal corresponding to the intensity of the input light. Each pixel may include components as described below with reference to FIG. 3.

The sense amplifiers 208 are elements in the read circuitry that are used to the read out of the digital signals from the digital pixel array 207. The sense amplifiers 208 sense low power signals from a bitline that represents the intensity of light captured by the pixels in the digital pixel array 207. The sense amplifiers 208 may generate a digital output signal by utilizing an analog-to-digital converter (ADC). In one or more embodiments, at least part of the sense amplifiers 208 may be included in the digital pixel array 207.

The line memory 209 temporarily stores the sensed digital values of the light intensity detected at the digital pixel array 207, as sensed by the sense amplifiers 208 and processed by digital block 202 before sending the digital values to the processor 102 via MIPI 205 as the sensor data 108.

The power conditioner 210 is a circuit that improves the quality of the power that is delivered to components of the photo sensor 104. The power conditioner 210 may maintain and deliver a constant voltage that allows the components of the photo sensor 104 to function properly. In one embodiment, the power conditioner 210 is an AC power conditioner which smooths the sinusoidal AC waveform. In alternate embodiments, the power conditioner 210 is a power line conditioner which takes in power and modifies it based on the requirements of the components connected to the power line conditioner.

The ramp generator and buffers module 211 comprises a ramp generator and buffers. The ramp generator is a function generator that increases its voltage to a particular value. The ramp generator may be used to avoid jolts when changing a load. The buffers provide electrical impedance transformation from one circuit to another to prevent the ramp generator from being affected by the load.

The sense amplification biasing module 212 provides biasing voltage signal to the sense amplifiers 208. The biasing voltage signal is a predetermined voltage for the purpose of establishing proper operating conditions of the sense amplifiers 208 such as a steady DC voltage.

Example Stacked Photo Sensor Assembly

Figure 3:
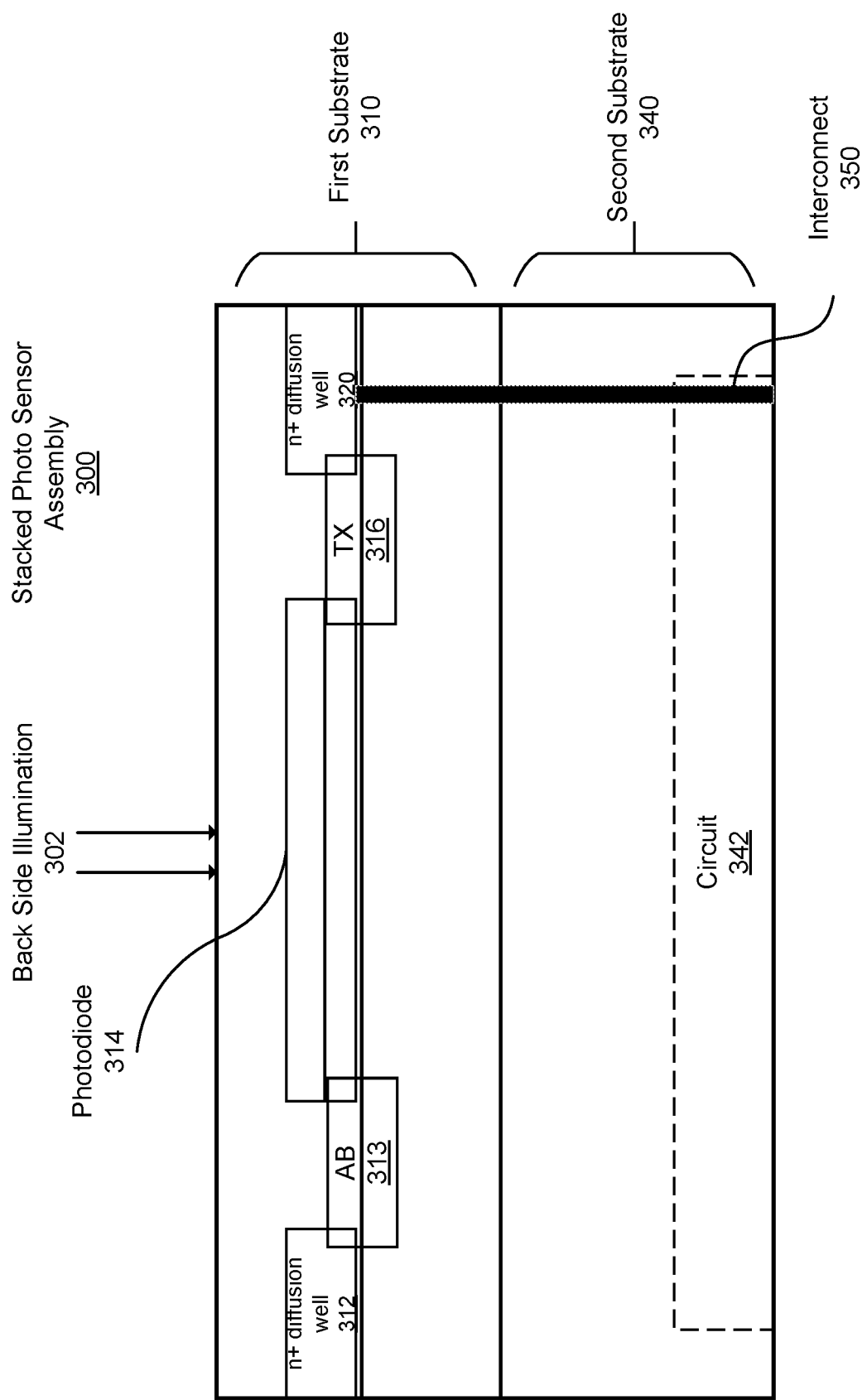
FIG. 3 is a cross-sectional view illustrating the stacked photo assembly, according to one embodiment.

FIG. 3 is a cross-sectional view illustrating the stacked photo sensor assembly 300, according to one embodiment. In one embodiment, the stacked photo assembly includes a first substrate 310 coupled to a second substrate 340. The first substrate 310 may be a back-side illumination 302 sensor that is flipped over and includes, among other components, a first n+ diffusion well 312, a photodiode 314, a transistor AB 313, a transistor TX 316, and a second n+ diffusion well 320.

Each of transistor AB 311 and transistor TX 316 includes an active layer, a drain electrode coupled to the active layer, a photodiode 314 that serves as a source of both transistor AB and transistor TX, an insulation layer over the active layer, and a gate electrode (not shown). By controlling a voltage level at the gates of the transistors AB 311 and the transistor TX 316, the transistors AB 311 and the transistor TX 316 can be turned on or off. The gates of these transistors receive signals from circuits external to the digital pixel array 207.

The first n+ diffusion well 312 is an N doped implant region formed in the first substrate 310. The first n+ diffusion well 312 receives photoelectrons that are transferred from the photodiode 314 when transistor AB 313 is turned on during non-exposure times. This is equivalent to a closed shutter mode in a traditional film camera. The transfer of photoelectrons from the photodiode 314 to the n+ diffusion well 312 ensures that no photoelectrons are accumulated on the photodiode 314, as the non-exposure times are periods when no signal is generated. The n+ diffusion well 312 is typically connected to a positive voltage source, for example VDD, so the photoelectrons are drained away. During an exposure time, which is equivalent to the shutter open mode in a film camera, both transistor AB 313 and transistor TX 316 are turned off and the photoelectrons are initially stored inside the photodiode 314. At the end of exposure, transistor TX 316 is turned on. As a result, the charge stored in the photodiode 314 is transferred to the second n+ diffusion well 320.

The photodiode 314 is a semiconductor device that converts light into an electric current. Current is generated when photons are absorbed in the photodiode 314. The photodiode 314 may be a p-n junction or PIN structure. When the intensity of light through back-side illumination 302 is higher, the amount of charge accumulated on the photodiode 314 is high. Similarly, when the intensity of light through back-side illumination 302 is lower, the amount of charge accumulated on the photodiode 314 is low.

The interconnect 350 may be a pixel level direct interconnect from n+ diffusion well 320 to a circuit 342 in the second substrate 340. In one embodiment, the interconnect 350 transmits a voltage signal that reflects the amount of charge transferred from the photodiode 314 to the n+ diffusion well 320. In alternative embodiments, the interconnect 350 transmits a current signal that reflects the amount of charge transferred from the photodiode 314 to the n+ diffusion well 320. The interconnect 350 carries the voltage signal to the circuit 342 for further processing such as sampling and analog-to-digital conversion. In still other embodiments, the stacked photo sensor assembly 300 may include additional interconnects that also transmit signals from the circuit 342 of the second substrate 340 to the first substrate 310. For example, signals for controlling transistor AB 313 and transistor TX 316 may be transmitted from the circuit 342 via these additional interconnects.

Embodiments move various circuit components provided on the first substrate 310 in conventional photo sensors to the second substrate 340, and connect the circuits of the second substrate 340 to the components in the first substrate 310 via the pixel level interconnect 350. The various circuit components moved to the second substrate 340 may include, among others, switches, amplifiers and current source. In this way, the area occupied by components in the first substrate 310 can be beneficially reduced and the fill factor can be increased.

Example Process of Operation in Stacked Photo Sensor Assembly

Figure 4:
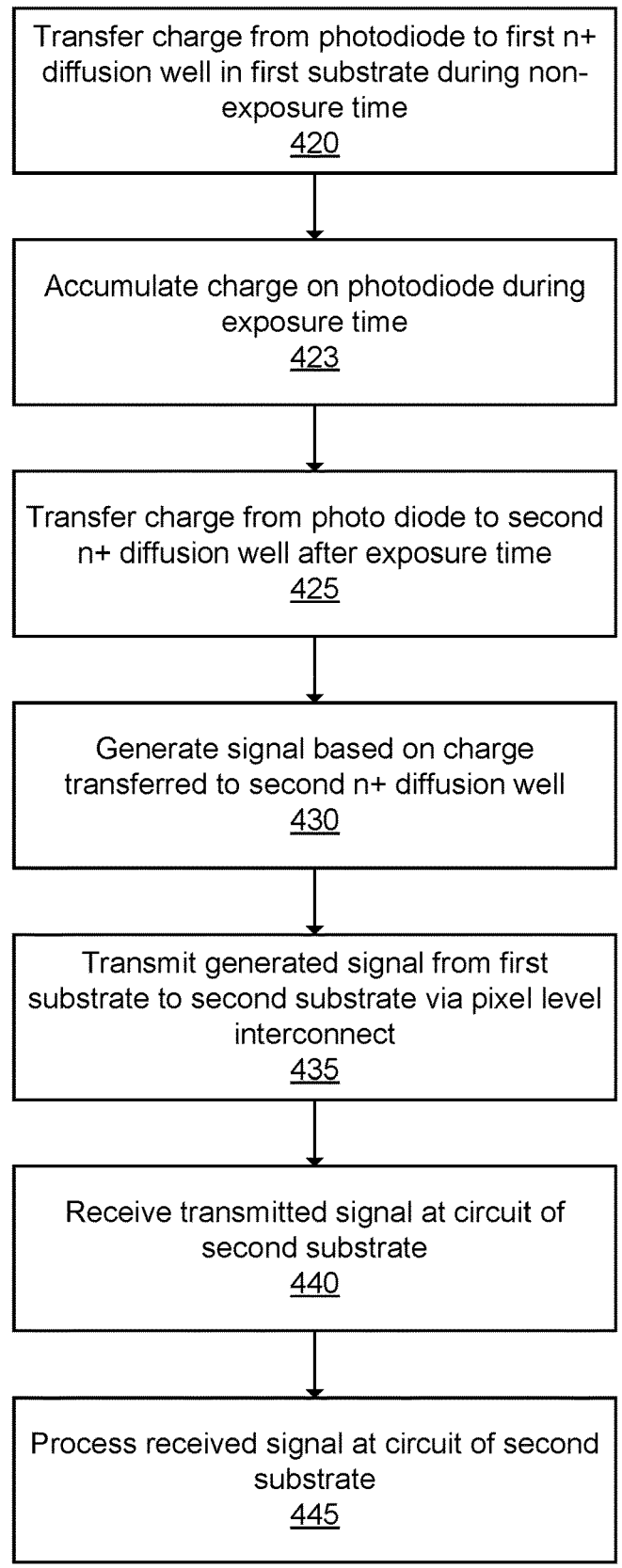
FIG. 4 is a view illustrating the process flow of the stacked photo sensor assembly.

FIG. 4 is a view illustrating the process flow of the stacked photo sensor assembly. First, charge is transferred 420 from the photodiode 314 to the first n+ diffusion well 312 in the first substrate 310 during a non-exposure, or shutter close period. Specifically, transistor AB 313 is turned on to provide a current path between the first n+ diffusion well 312 and the photodiode 314. Second, during the exposure time, the shutter is open, and the charge is accumulated on the photodiode 314.

After the exposure time ends, charge accumulated in the photodiode 314 is transferred 425 to the second n+ diffusion 320. Specifically, transistor AB 313 is turned off, and transistor TX 316 is turned on to provide a current path to transfer the charge in the photodiode 314 to the second n+ diffusion well 320.

Based on the charge transferred to the second n+ well 320, a signal is generated 430 at the first substrate 310. The signal may be a voltage signal or a current signal.

The signal is then transmitted 435 from the first substrate 310 to the second substrate 340 stacked on the first substrate 310 via a pixel level interconnect 350.

The circuit 342 in the second substrate 340 receives 440 the signal transmitted over the interconnect 350. The circuit 342 processes 445 the received signal for sending to the processor 102.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A pixel of a photo sensor comprising:
    a portion of a first substrate comprising:
        a photodiode for detecting light, and
        a diffusion well associated with the photodiode to store charge generated from the photodiode and to generate a signal based on the stored charge, an amount of the charge stored in the diffusion well dependent on an intensity of the light incident on the photodiode;
    a portion of a second substrate having a circuit for processing the signal from the first substrate, the circuit formed on a surface of the second substrate facing away from the first substrate; and
    a direct pixel-level interconnect that connects the diffusion well of the first substrate to the circuit of the second substrate to carry the signal from the diffusion well to the circuit.

2. The pixel of a photo sensor according to claim 1, wherein the circuit is a first circuit; and
    wherein the first substrate further comprises:
        a first transistor to be turned on by a second circuit during a non-exposure time of the pixel to divert the charge away from the diffusion well; and
        a second transistor to be turned on by the second circuit to transfer the charge stored in the photodiode to the diffusion well.

3. The pixel of a photo sensor according to claim 1, wherein the first substrate is P doped, and the diffusion well is N doped.

4. The pixel of a photo sensor according to claim 1, wherein the first substrate has a front surface formed with the photodiode and the diffusion well, the front surface facing the second substrate.

5. The pixel of a photo sensor according to claim 1, wherein the second substrate has a front surface formed with the circuit and a rear surface opposite to the front surface, the front surface facing away from the first substrate and the rear surface facing the first substrate such that the direct pixel-level interconnect penetrates through the second substrate from the rear surface to reach the circuit formed on the front surface.

6. The pixel of a photo sensor according to claim 1, wherein the signal is a voltage signal dependent on the amount of charge stored in the diffusion well and a capacitance of the diffusion well.

7. The pixel of a photo sensor according to claim 1, wherein the processing comprises at least one of sampling and analog-to-digital conversion.

8. A method for operating a photo sensor, the method comprising:
    detecting light by a photodiode in a first substrate;
    storing charge generated by the photodiode by a diffusion well in the first substrate, an amount of the charge dependent on an intensity of the light incident on the photodiode;
    generating a signal in the first substrate based on the charge stored in the diffusion well;
    sending the signal from the first substrate to a circuit formed on a surface of a second substrate facing away from the first substrate via a direct pixel-level interconnect that connects the diffusion well of the first substrate to the circuit; and
    processing the signal by the circuit in the second substrate.

9. The method according to claim 8, further comprising:
    turning on a first transistor during a non-exposure time to divert the charge away from the diffusion well; and
    turning on a second transistor to transfer the charge stored in the photodiode to the diffusion well.

10. The method according to claim 8, wherein the first substrate is P doped, and the diffusion well is N doped.

11. The method according to claim 8, wherein the first substrate has a front surface formed with the photodiode and the diffusion well facing the second substrate.

12. The method according to claim 8, wherein the second substrate has a front surface formed with the circuit and a rear surface at an opposite side of the second substrate, the rear surface facing the first substrate such that the direct pixel-level interconnect penetrates through the second substrate from the rear surface to reach the front surface.

13. The method according to claim 8, wherein the signal is a voltage signal dependent on the amount of the charge transferred from the photodiode to the diffusion well.

14. The method according to claim 8, wherein the processing comprises at least one of sampling and analog-to-digital conversion.

15. The pixel of a photo sensor according to claim 1, further comprising an insulation layer sandwiched between the first substrate and the second substrate; and
   wherein the direct pixel-level interconnect penetrates through the insulation layer.

16. The pixel of a photo sensor according to claim 2, wherein the second circuit is formed in the second substrate.

* * * * *